United States Patent
Ivanov et al.

(10) Patent No.: US 6,344,659 B1
(45) Date of Patent: Feb. 5, 2002

(54) SUPERCONDUCTING TRANSISTOR ARRANGEMENT AND A METHOD RELATING THERETO

(75) Inventors: Zdravko Ivanov; Robert Shekhter; Anatoli Kadiqrobov, all of Göteborg; Tord Claeson, Mölndal; Mats Jonson, Göteborg; Erland Wikborg, Danderyd, all of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/448,709

(22) Filed: Nov. 24, 1999

(30) Foreign Application Priority Data

Nov. 27, 1998 (SE) .............................................. 9804088

(51) Int. Cl.$^7$ .............................................. H01L 29/06
(52) U.S. Cl. ............................ 257/30; 257/31; 257/34; 257/35; 257/36; 257/38; 257/39
(58) Field of Search .............................. 257/30, 31, 34, 257/35, 36, 38, 39

(56) References Cited

U.S. PATENT DOCUMENTS

| | | | | |
|---|---|---|---|---|
| 3,599,009 A | * | 8/1971 | Parmentier et al. | ......... 307/201 |
| 4,982,248 A | | 1/1991 | Laibowitz et al. | |
| H1570 H | * | 8/1996 | Lux et al. | ...................... 257/25 |
| 5,550,389 A | | 8/1996 | Nishino et al. | |
| 5,665,618 A | * | 9/1997 | Meyer et al. | ................ 438/172 |
| 5,872,368 A | | 2/1999 | Osofsky et al. | |

OTHER PUBLICATIONS

Shelankov, A.L., "Resistance of N–S Interference at Low Temperatures" JETP Lett., vol. 32, No. 2, Jul. 20, 1980, pp. 111–115, American Institute of Physics (1981).

Blonder, G.E. et al., "Transition from Metallic to Tunneling Regimes in Superconducting Micrconstrictions: Excess Current, Charge Imbalance, and Supercurrent Conversion" Physical Review B, vol. 25 No. 7, pp. 4515–4532, The American Physical Society (Apr. 1, 1982).

Lambert, CJ, "Generalized Landauer Formulae for Quasi –Particle Transport in Disordered Superconductors" J. Phys.: Condens. Matter 3 (1991) pp. 6579–6587. IOP Published Ltd.

Lambert, CJ, "Quantum Interference from Superconducting Islands in a Mesoscopic Solid" J. Phys.: Condens. Matter 5 (1993) pp. 707–716. IOP Publishing Ltd.

Antonov, V.N., et al., "Phase Controlled Conductance of Mesoscopic Structures with Superconducting 'Mirrors'" Physical review Letters, vol. 74, No. 26, pp. 5268–5271, The American Physical Society (Jun. 26, 1995).

(List continued on next page.)

Primary Examiner—Olik Chaudhuri
Assistant Examiner—Wai-Sing Louie
(74) Attorney, Agent, or Firm—Burns, Doane, Swecker & Mathis, L.L.P.

(57) ABSTRACT

The present invention relates on an interferometer arrangement comprising a source electrode and a drain electrode, a base electrode to which the source electrode and the drain electrode are connected through tunnel barriers, the base electrode thus forming a double barrier quantum well, and first and second superconducting gate electrodes to control the source-drain current. The base electrode comprises a ferromagnetic material enabling resonant tunneling of source-drain electrons when there are bound states within the quantum well structure matching the energy of said source-drain electrons. The invention also relates to a logical element comprising such an interferometer arrangement and to a method of controlling the conductance of an interferometer.

18 Claims, 4 Drawing Sheets

OTHER PUBLICATIONS

Lux, et al., "Variable Lateral Quantum Confinement Transistor" United States Statutory Invention Registration No. H1570 (Aug. 6, 1996).

Blom, H.A., et al., "Dissipative Electron Transport Through Andreev Interferometers" Physical Review B, vol. 57, No. 16, pp. 9995–10016, The American Physical Society (Apr. 15, 1998).

Toyoda, Etsuko, et al., "Magnetoresistance Oscillations of Qualsi–Ballistic Two–Dimensional Electron Gas Coupled with a Superconducting Ring" Physica B 249–251 pp. 472–475. Elsevier Science B.V. (1998).

Lambert, CJ, et al., "Phase–Coherent Transport in Hybrid Superconducting Nanostructures" J. Phys,: Condens. Matter 10 (1998) pp. 901–941. IOP Publishing Ltd.

* cited by examiner

SUPERCONDUCTING TRANSISTOR ARRANGEMENT AND A METHOD RELATING THERETO

BACKGROUND

The present invention relates to an interferometer arrangement, particularly to a transistor arrangement such as a resonant tunneling transistor arrangement with superconducting gate electrodes. The invention also relates to a logical element comprising such a resonant tunneling transistor. Still further the invention relates to a method of controlling the conductance of a tunneling superconductor arrangement.

Resonant tunneling transistor devices are known which consist of a normal metal source electrode and a normal metal drain electrode which are connected through tunnel barriers to a normal metal island forming a base electrode. However, even if the output conductance, G, of such devices can be varied, it can not be varied or increased to a sufficient extent for a number of applications. In such devices the output conductance can be varied through varying the supercurrent in the superconducting gate electrodes used to control the source-drain current. Thus, what is needed to change the conductance is the provision of a variation in this supercurrent to vary the quantum mechanical phase difference $\Delta\phi$ between the two superconducting gate electrodes. It is a problem that such devices only find a limited practical use and they probably would not find an extended application as logical elements since they merely can be used as OR-elements but also as such they can hardly be used. Such a device is described by E. Toyoda and H. Takayanagai, in Proceedings of 12th International Conference on the Electronic Properties of Two-Dimensional Systems, EP2DS, Tokyo 1997. Furthermore another such device is described in Phys. Rev. Lett. Vol. 74, p 5268 (1995) by V. T. Petrashov, V. N. Antonov, P. Delsing and T. Claeson which herewith is incorporated herein by reference.

SUMMARY

What is needed is therefore a transistor arrangement as referred to above, the output conductance of which can be made considerably higher than in hitherto known arrangements and which enables a larger variation in conductance than known arrangements. Particularly an arrangement is needed through which the output conductance can be controlled in an easy and flexible manner. Still further a transistor arrangement is needed which is efficient, easy to fabricate, reliable and which can produce a most pronounced output signal. Still further a method of controlling the conductance of a tunneling superconducting arrangement, e.g. a transistor is needed which fulfills the above mentioned objects.

Therefore a transistor arrangement is provided which comprises a source electrode and a drain electrode, a base electrode to which said source and drain electrodes are connected through tunnel barriers so that the base electrode forms a double barrier quantum well. First and second superconducting gate electrode means are provided to control the source-drain current $I_{SD}$. The base electrode comprises a ferromagnetic material which enables resonant tunneling of source-drain electrons when there are bound states within the quantum well matching the energy of the source-drain electrons. Otherwise the double barrier quantum well prevents the source-drain current, i.e. the transport of source-drain electrons. However, if there are such bound states within the quantum well matching the energy of the source-drain electrons, they will be able to pass through the ferromagnetic base electrode, particularly a mesoscopic ferromagnetic island, by resonant tunneling. The bound states in the quantum well structure are also called Andreev levels which can be said to be provided by and controlled by the superconducting gate electrode means.

According to the invention the output conductance (G) depends on a first and a second parameter and first and second controlling means are provided to control the output conductance through controlling said parameters. The first parameter is the phase difference $\Delta\phi$ between the first and the second superconducting electrodes and first controlling means are provided enabling the control of said phase difference. Said first controlling means can be provided in different ways. According to one advantageous implementation the first controlling means comprises means for changing the super-current, $I_G$, provided by a control current source supplied between the two superconducting gate electrodes.

In an alternative embodiment the first controlling means comprises means connecting the first and the second superconducting gate electrodes so as to form a loop and means for application of a magnetic field to said loop.

The second parameter on which the output conductance depends is the exchange interaction potential (energy) of the ferromagnetic base electrode. The second controlling means advantageously comprises a voltage source and a voltage ($V_B$) is applied to said ferromagnetic base electrode. The output conductance, G, according to the invention is given by $\Delta I_{SD}/\Delta V_B$ and thus is strongly dependent on the quantum mechanical phase difference $\Delta\phi$ between two superconductors and of $V_B$. In order to provide a particularly high conductance, or particularly an output signal according to a particular implementation, the phase difference $\Delta\phi$ is controlled to be substantially $(2n+1)\phi$, wherein n=0, ±1, . . . Advantageously the applied voltage $V_B$ should substantially correspond to the interaction energy $2h_O/e$ of the ferromagnetic base electrode. If $\Delta\phi$ is not equal to an odd multiple of $\pi$, there will be substantially no resonant tunneling and the conductance, which is proportional to the (transparency)$^2$, i.e. the transport of source-drain electrodes, will be low for any applied voltage $V_B$. If however $V_B$ is substantially equal to, or close to, $2h_O/e$, a variation in the supercurrent $I_G$ through the gate electrode will result in a variation in the output conductance over a wide range. This is due to the fact that the Andreev levels then will be concentrated near the exchange energy $h_O$, thus considerably increasing the resonant tunneling. Thus, if the applied voltage $V_B$ is decreased to a value well below $2h_O/e$, the macroscopic resonant transmission of electrons will be switched off as well as the sensitivity of the conductance G to variations in the phase difference. This means that a very high conductance, or an output signal, will be observed, according to the present invention, only when the first and the second parameters both fulfill the given requirements at the same time or, in other words, when $I_G$ (a supercurrent produced in an appropriate manner) and $V_B$ both are present.

Maximum output conductance is particularly provided for $\Delta\phi=2(n+1)\times\pi$ and $V_B=2h_O/e$. In an advantageous embodiment the source and the drain electrodes comprise a normal metal such as Au, Ag, Bi. The superconducting gate electrodes are advantageously made of Pb, Al, Nb, Yt, Ba, CuO but also other alternatives are possible. High temperature superconducting (high-$T_C$) materials can be used as well as non-high-$T_C$-materials. In advantageous implementations the ferromagnetic base electrode consists of La, Sr, Ca, MnO but also other ferromagnetic materials are possible.

In a particular implementation the arrangement forms a logical AND-element, an output signal being provided only when $\Delta\phi \approx 2(n+1)\times\pi$ and $V_B \approx 2h_O/e$, i.e. when both $V_B$ and $I_S$ are input or activated.

In a particular implementation the ferromagnetic base electrode is mesoscopic.

According to the invention a logical element may also be provided which comprises a resonant tunneling transistor comprising a source electrode and a drain electrode, a base electrode to which said source and drain electrodes respectively are connected via tunnel barriers and first and second superconducting gate electrodes arranged to control the source-drain current $I_{SD}$. The base electrode comprises a ferromagnetic material, particularly an island of a mesoscopic ferromagnetic material, and to provide an output signal corresponding to a high conductance, a first input signal is provided to produce a phase difference between the superconducting gate electrodes being $(2n+1)\pi$ and a second input signal in the form of a voltage $V_B$ is applied to the ferromagnetic base electrode, which voltage approximately corresponds to $2h_O/e$ which is the interaction exchange energy of the ferromagnetic base electrode.

Particularly the output signal corresponding to the output conductance, which should be high, depends on the first and the second parameter respectively and first and second controlling means are provided to control the output conductance wherein both said first and second controlling means have to be activated to provide an output signal. The first input signal is particularly provided by first controlling means comprising means for changing the supercurrent and second controlling means comprising a voltage source provides the voltage $V_B$. In a particular implementation the second controlling means comprises means connecting the first and the second superconducting gate electrodes to provide a loop, or they are formed as loops, and means for applying a magnetic field to said loop resulting in the phase difference being an odd multiple of $\pi$. Alternatively said first controlling means comprises means for changing the super current such as a control current source thus affecting the phase. The second controlling means particularly comprises a voltage source to provide the voltage $V_B$.

According to the invention a circuit is also provided which comprises a number of logical elements of which at least some of the AND elements comprise logical elements according to any one of claims 15–18.

Particularly a method of controlling the conductance of a resonant tunneling superconductor arrangement, e.g. a transistor is also provided. The transistor comprises a source and a drain electrode, a base electrode to which the source electrode and the drain electrode respectively are connected through tunnel barriers, the base electrode forming a double barrier quantum well, and first and second superconducting gate electrodes controlling the source-drain current. The method includes the steps of:

controlling the phase difference between the superconducting gate electrodes to make it assume such a value that resonant tunneling is enabled, applying of voltage to the base electrode which enables transportation of electrons through the provision of Andreev levels, i.e. bound states in the quantum well. Particularly the method comprises the steps of applying a voltage close to $2h_O/e$ corresponding to the interaction exchange energy of the base electrode which comprises a ferromagnetic material, and providing a phase difference between the superconducting gate electrodes which corresponds to $(2n+1)\pi$, wherein n=0, ±1, ... The provision of a phase difference which is an odd multiple of $\pi$ can be done in different ways, such as interconnecting the superconducting gate electrodes to form a loop, and applying a magnetic field through said superconducting loop. Alternatively the phase difference can be controlled through changing the current $I_G$ using for example a control current source thus producing a supercurrent $I_S$ flowing through the superconductors..

BRIEF DESCRIPTION OF THE DRAWINGS

The invention will in the following be further described in a non-limiting way with reference to the accompanying drawings in which.

DETAILED DESCRIPTION

Figure 1:
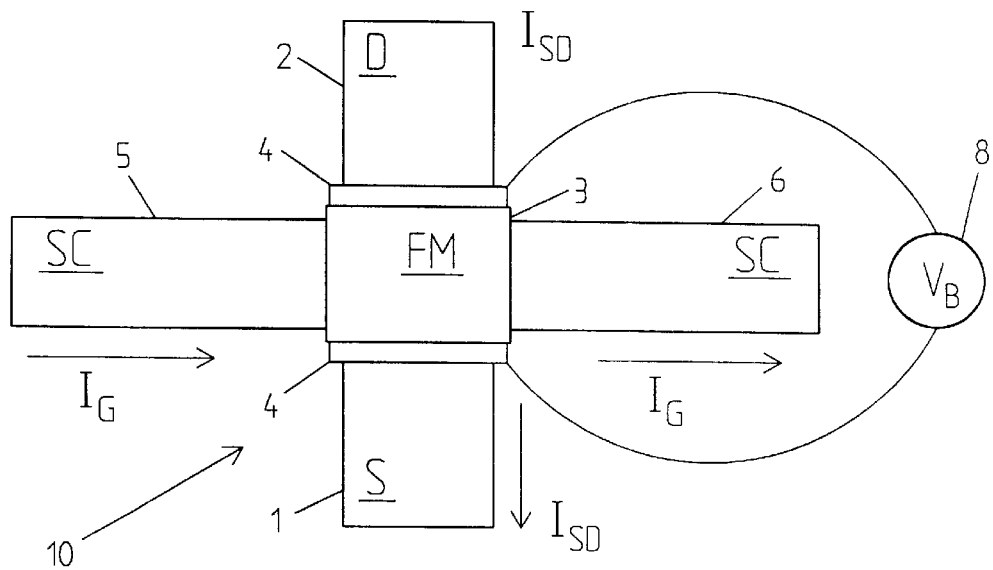
FIG. 1 shows a first embodiment of a transistor arrangement according to the invention.

FIG. 1 shows a resonant tunneling transistor arrangement 10 according to the invention. A source electrode S 1 and a drain electrode D 2 are via tunnel barriers 4,4 connected to a base electrode 3 which according to the invention comprises a ferromagnetic. Particularly it comprises a mesoscopic ferromagnetic "island". The base electrode 3 are also connected to a superconducting gate electrode means, particularly first and second superconducting gate electrodes 5,6 (SC,SC) controlling the source-drain current $I_{SD}$.

The source and drain electrodes 1,2 may particularly consist of a normal metal and they can be said to form normal metal electron reservoirs. The tunnel barriers 4,4 make the base electrode 3 form a double barrier quantum well which prevents a current to flow between the source and the drain electrode unless there are bound states within the quantum well matching the Fermi energy of the source-drain electrons. If there are such bound states, the source-drain electrons will be able to pass through the base electrode 3 through resonant tunneling. The bound states in the quantum well which also are denoted Andreev levels, are controlled by the superconducting gate electrodes 5,6.

The phenomenon of bound states in a quantum well, or so called Andreev levels, will now be briefly explained. At the interface between a metal and a superconductor there are in principle three electron scattering processes when an electron tries to tunnel into the superconductor from the normal metal. These scattering processes consist of electron transmission, electron reflection and the above mentioned Andreev reflection. The Andreev reflection is due to the fact that on that side of the interface where there is normal metal, there are conduction electrons and holes whereas on the superconductor side there are Cooper pairs of electrons having opposite spins. An electron trying to tunnel into a superconductor thus has to form a Cooper pair on the superconductor side and this can be achieved through a quantum mechanical phenomenon of simultaneously reflecting a hole which has a momentum which is opposite to that of the electron, at the interface as the electron tunnels into the superconductor. The reverse process, i.e. when a hole is incident onto a superconductor from the metal side, can in analogy therewith be illustrated as a removal of a Cooper pair from the superconductor.

If on the other hand the metal is a ferromagnet, the spin of the electron interacts with the spins of the crystal electrons. The result thereof will be that electrons with spins up and down have energies differing by the interaction energy of the electron spin and the spontaneous magnetic moment of the ferromagnet, $h_O$. Thus, under Andreev reflection two electrons having opposite spins leave the ferromagnet to create a Cooper pair in the superconductor. This means that after the Andreev reflection, the reflected hole has a spin which is opposite to the spin of the incident electron and their energies therefore differ by the magnetic energy $h_O$. (This magnetic energy has to be lower than the energy gap of the superconductor, otherwise the Cooper pair cannot be formed.)

Figure 2:
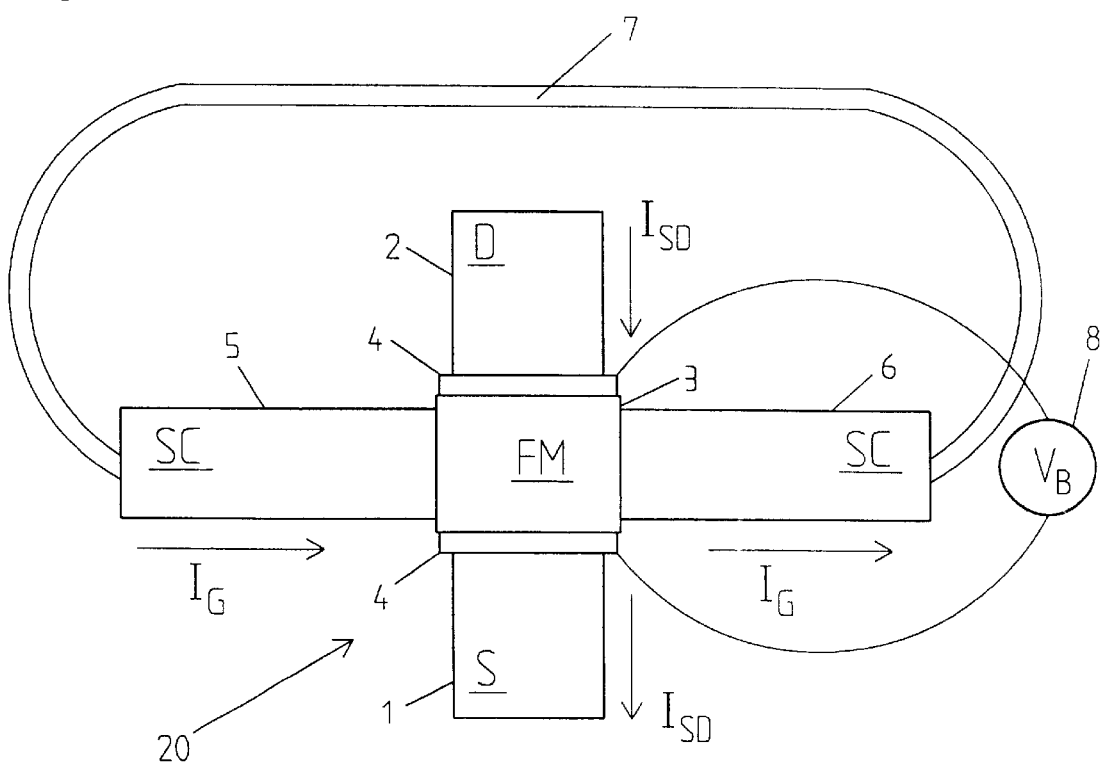
FIG. 2 shows a second embodiment of an arrangement according to the invention, FIG. 3A schematically illustrate electrons with opposite spins occupying different energy bands.

The electronic transport through the base electrode 3 in the form of a ferromagnetic island in FIGS. 1 and 2 thus takes place through such Andreev reflected electrons and holes. An electron incident onto the ferromagnetic-superconductor interface will be reflected as a hole, which, when it in turn is incident onto the opposite ferrmomagnetic-superconductor interface will be reflected as an electron which in turn, when incident onto the opposite ferromagnetic-superconductor interface again be will be reflected as a hole and so on ad infinitum. Such continuous reflections or bound states constitute the so called Andreev levels.

It turns out that if the energy (E) of an incident electron is equal to $h_O$, the momenta of the electron and the hole respectively are equal. In that case the hole is reflected exactly in the direction opposite to that of the incident electron and the hole will exactly repeat the (classical) trajectory of the electron. This means that the phase gain along any closed electron-hole trajectory will be zero independently of the form and the length of the trajectory. This is a condition for normal transportation through Andreev levels in ferromagnets.

An analyse of the normal transportation through Andreev levels in the ferromagnetic region shows that the transport current is determined by the probability that an incoming electron (of energy E) is transmitted to the other reservoir, i.e. to the other electrode, and that it is reflected back as a hole, of energy –E in relation to the Fermi level. The electron (hole) motion in the ferromagnetic base electrode can either be diffusive of ballistic dependending on whether the size of the ferromagnetic island is larger than or smaller than the free path length of the electron. If it is smaller than the free path length of the electron, scattering will only take place at the ferromagnetic-superconductor boundaries as Andreev reflections and at the potential barriers between the electron reservoirs (source/drain electrodes respectively) and the ferromagnetic base electrode.

The switching time t of such an arrangement is of the order $\Lambda/v_F$, $\Lambda$ being a characteristic transfer distance of an electron and $v_F$ being the Fermi velocity of the electron.

For a diffusive ferromagnet $\Lambda=L^2/l_i$, wherein L is the typical length of the device, $l_i$ is the mean free path of electrons in the ferromagnet. If $L=5\times10^{-5}$ cm and $l_i=10^{-6}$ cm, the switching time will be $25\times10^{-12}$ s. For a ballistic ferromagnet $\Lambda=L$ and the switching time will be $t=5\times10^{-13}$ s. (The above numerical values are merely given for illustrative purposes.)

FIG. 1 shows a first embodiment of an inventive arrangement 10. The source-drain current, i.e. the transport current $I_{SD}$ between the source electrode 1 and the drain electrode 2 is given by the probability that electrons are transmitted through the ferromagnetic base electrode island (FM) 3 from the source S to the drain D. This probability equals 1 if the energy of the electrons coincide with an Andreev level since then resonant tunneling takes place, in all other cases it is much smaller than one. If a control current source (not shown in the figure) is applied between the two superconducting gate electrodes (SC) 5,6, resulting in a control current, $I_G$, a quantum mechanical phase difference $\Delta\phi$ will appear between the wave functions of the two superconductors 5,6 contacting the base electrode 3. The output conductance $G=\Delta I_{SD}/\Delta V_B$ turns out to be strongly dependent on this phase difference. If the phase difference $\Delta\phi$ is not equal to $(2n+1)\pi$, there will be no resonant tunneling and the conductance which is proportional to the square of the transparency, will be low irrespectively of which is the applied voltage $V_B$.

If, however, the phase difference $\Delta\phi$ is equal to $(2n+1)\pi$, or an odd multiple of $\pi$, and the applied voltage $V_B$ at the same time is close to the exchange potential $2h_O/e$ of the ferromagnetic base electrode, the conductance will increase very much. This is due to the Andreev levels in a ferromagnet being concentrated near the exchange energy $h_O$ at which resonant transmission of electrons from the source to the drain thus takes place. Thus, the output conductance G depends on the two parameters $\Delta\phi$ and $V_B$ forming said first and second parameters. When $V_B$ is close to $2h_O/e$, a variation in the supercurrent $I_G$ through the gate electrodes, i.e. the superconductor electrodes, will vary the output conductance to a great extent. If the applied voltage $V_B$ is decreased, the macroscopic resonant transmission is switched off and therewith also the sensitivity of the conductance G to the phase difference $\Delta\phi$. Therefore, an output signal, or a very high conductance, is provided only when both parameters fulfills the given conditions are provided by first and second controlling means or in other words when both $I_S$ and $V_B$ are present. Therefore the arrangement can be described as a logic AND element.

According to the embodiment as illustrated in FIG. 1, the first controlling means comprises a control current source producing a control current $I_G$, thus affecting the phase, which is implemented to control the phase difference.

In an alternative arrangement 20 shown in FIG. 2 interconnecting means 7 are provided so that the first and the second superconductor gate electrodes 5,6 form a loop to which a magnetic field is applied, so that a supercurrent flows through the superconductors in order to in this manner control the phase difference.

The second controlling means consists of a voltage source 8 applying a voltage $V_B$ to the ferromagnetic base electrode 3 both in the arrangement 10 of FIG. 1 and in the arrangement 20 of FIG. 2. The functioning will now be somewhat more thoroughly explained with reference to FIGS. 3A–6.

As referred to above large oscillations in the conductance for a superconductor—ferromagnet—superconductor arrangement also called an Andreev interfometer are produced because of the resonant transmission of normal electrons through Andreev levels arising when certain conditions relating to applied voltage and produced phase difference are provided, or fulfilled. In structures using a normal conductor as a base electrode, it has been shown that the sensitivity of the conductance of such mesoscopic systems to the superconductor phase difference is high, see for example J. Phys.: Condens. Matter, 10, 901 (1997) by C. J. Lamberg and R. Raimondi. As referred to above this is due to a quantum interference of quasiparticles due to Andreev scattering at interfaces between normal metal and superconductor. This is caused by the fact that the phase of the superconducting condensate is imposed on the quasiparticle wave function in the normal metal. Thus considerable oscillations of the conductance of the normal metal are produced as a function of the phase difference between the superconductors. A single electron in a normal metal having with energy below the superconductor energy gap can not penetrate into the superconductor as referred to above but under Andreev reflection the incident eletron is transformed into a hole with an oppositly directed spin. The spin flip does not effect the interference pattern of a non-magnetic normal metal since all energy levels are twice degenerated with respect to the spin direction but, in ferromagnets, it has been realized that this degeneracy will be lifted due to the interaction of the electron spin with the ferromagnet spontaneous moment which in the following will be called the (exchange) interaction energy $h_O$.

Figure 3A:
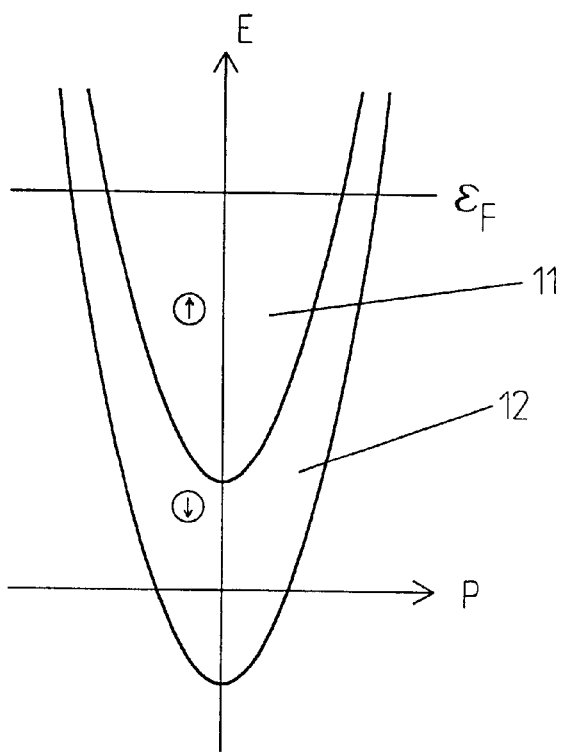
FIG. 3B is a different illustration of the electrons with opposite spins as in FIG. 3A explicitly indicating the exchange interaction energy $h_O$, FIG. 4A shcematically illustrates the oscillations of conductance for an arrangement according to the invention, FIG. 4B schematically illustrates the hole-electron exchange taking place in FIG. 4A, FIG. 5 schematically illustrates the dependence of the resonance on applied energy and phase difference.

In FIG. 3A is illustrated how electrons with opposite spins occupy different energy bands. In the figure E corresponds to the Fermi energi, $\epsilon_F$ denote the Fermi level and P indicate the pulse input. An upwardly directed arrow means spin up whereas a downwardly directed arrow means spin down. Electrons with spin up are here supposed to occupy an energy band with energy $E=(p^2/2m)+h_O$, in FIG. 3A denoted the first energy band 11 whereas electrons with spin down having an energy $E=(p^2/2m)-h_O$ occupy the energy band denoted 12 in the figure. The change of the spin direction associated with Andreev scattering shifts the reflected qusiparticle from one band into the other which influence is the quantum interference.

Figure 3B:
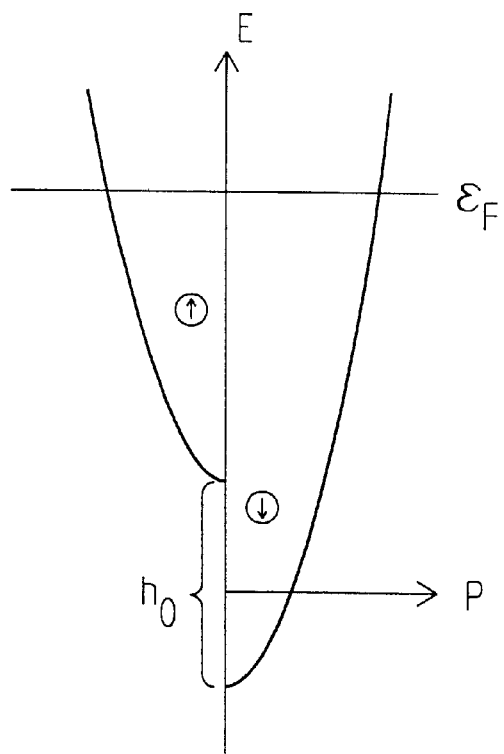

In FIG. 3B the exchange interaction energy $h_O$ is explicitly illustrated in a schematical manner and again the arrows indicate electrons with spin up and spin down respectively. In other aspects FIG. 3B is similar to that of FIG. 3A.

Figure 4A:
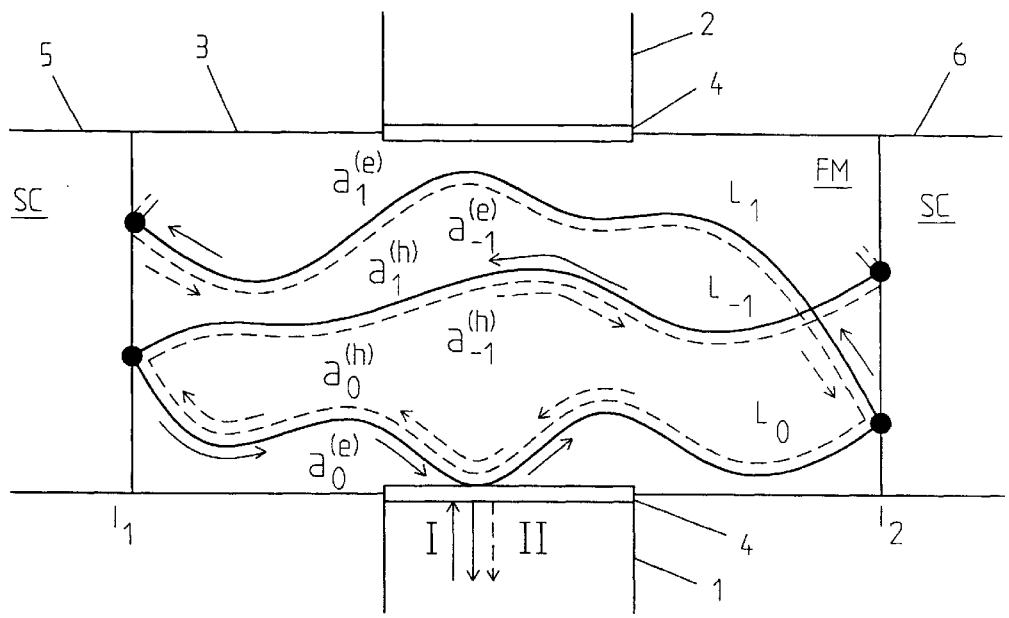

FIG. 4A shows a section of an arrangement as in FIGS. 1 and 2 with superconducting gate electrodes (SC) 5,6, a ferromagnetic base electrode (FM) 3 and source and drain electrodes (S,D) 1,2 forming electron reservoirs. As referred to earlier the phase difference between the superconductors can be changed for example either by changing the current or through the application of a magnetic field through a superconducting loop formed by said superconductors 5,6 and interconnecting means (not shown) or the superconductors as such are formed in the shape of a loop so that a supercurrent flows. In the figures $I_1$, $I_2$ denote interfaces superconductor/ferromagnet and ferromagnet/superconductor respectively. What is illustrated in the figure can also be said to be an Andreev interferometer and it is assumed that the ferromagnetic mesoscopic part of the interferometer is diffusive and the motion of qusiparticles inside is semiclassical which is the case if the Fermi wavelength $\lambda_F$ is the shortest length in the system. If these conditions are fulfilled, the charge transport in the system can be analyzed in the terms of classical trajectories of electrons and holes, see for example Phys. Rev. B 57, 9995 (1998), by H. A. Blom, et al, which herewith is incorporated herein by reference. A paramagnetic effect at Andreev reflections essentially modifies the formation of Andreev levels.

The momentum of an electron with spin up $p_\uparrow^e$/spin down $p_\downarrow^e$ and the momentum of the reflected hole with spin down $p_\downarrow^h$/spin up $p_\uparrow^h$ is given by:

$$p_{\uparrow \downarrow}^e = (p_F^2 + 2m(E \pm h_O))^{1/2}$$

$$p_{\uparrow \downarrow}^h = (p_F^2 - 2m(E \pm h_O))^{1/2}$$

E being the energy of the incident electron measured from the Fermi level $\epsilon_F$, $p_F$ being the Fermi momentum and m being the mass of the electron. This gives that, in contrast to the non-magnetic case, near the Fermi level (E≈0) the electron and the hole momenta in the ferromagnet are different and if $h_O$ is large enough (usually $h_O$ is larger than the Thouless energy) the interference effects are absent due to the destructive interference. This shows that there is a conflict between superconductivity and magnetic ordering. However, interference effects in the non-superconducting transport can exist but at finite applied voltage $V_B$.

If the energy $|E| \approx h_O$, the change in the quasiparticle momentum under Andreev reflection is small whereas the velocity changes sign, and an essential cancelation of the phase gain along trajectories including electron-hole transformation at the superconducting boundaries takes place. At $E=h_O$ any such classical trajectory is closed since the momentum of the electron is the same as that of the hole with the opposite spin while the velocities of the same are of the opposite directions and such a cancelation is completed at $\Delta\phi=(2n+1)\pi$, wherein n=0, ±1, ... independently of its geometry and of its length. According to the Bohr-Sommerfield quantization all such trajectories belong to one and the same energy level. This means that the energy level at $E=h_O$ is highly degenerated with the degeneration number $N_\perp \approx S/\lambda_F^2$ wherein S is the cross-sectional area of the superconductor—ferromagnet—superconductor junction. In analogy with the non-magnetic case the possibility of the macroscopic degeneration of Andreev levels results in huge oscillations in conductance, thus, corresponding to a high sensitivity of the non-superconducting transport to the superconductor phase difference $\Delta\phi$.

In FIG. 4A two electron reservoirs of normal electrons, source and drain electrodes 1,2, (the reference signs are the same as in FIGS. 1 and 2) are weakly coupled to the ferromagnetic base electrode 3 which is of a mesoscopic size through barriers 4,4 having a low transparency $t_r<1$. It is supposed that a voltage $V_B$ (not shown; c.f. FIG. 1) is applied to the electron reservoirs or source and drain electrodes 1,2 so that a normal current I flows via the ferromagnetic base electrode of the heterostructure. In a realistic situation a normal reflection accompanies the Andreev electron-hole scattering at a boundary between a ferromagnet and a superconductor, in the following denoted FM-SC boundary. The reason therefore is that there is a potential barrier (or a difference in the Fermi velocities of the metals) that normally is present at the FM-SC interfaces. Normally such scattering suppresses the sensitivity of the electron spectrum to the superconductor phase difference transforming Andreev levels into such that are produced in an isolated metal due to the spatial quantization. However, resonant tunneling through Andreev levels requires that the effects of normal back-scattering be small. It is supposed that the normal reflection probability is much smaller than 1 whereas the square of the absolute value for normal reflection plus the square of the probability of Andreev reflection equals one.

According to the Landauer-Lambert formula as discussed in J. Phys.: Cond. Matter 3, 6579 (1991); Cond. Matter 5, 707 (1993), by C. J. Lambert, the current and the conductance are determined by the probability that an electron incoming from a reservoir undergoes an electron-hole transmission. In a small energy interval $|E-h_O|<E_{Th}$, wherein $E_{Th}=hD/L^2 2\pi$ is the Thouless energy, D is the diffusion factor and L is the distance between the superconductors, where the destructive interference is absent and the effect of resonant tunneling through Andreev levels determines sharp maxima of the conductance $G(\phi)$ around the superconductor phase difference $\phi=(2n+1)\pi$. The condition that the $|E-h_O|$ should be much smaller than the Thouless energy permits consideration of trajectories of the electron and the hole which are connected with the Andreev reflections at the FM-SC boundary as being classically indistinguishable. An injected electron (or a hole) undergoes a splitting at the potential.

Figure 4B:
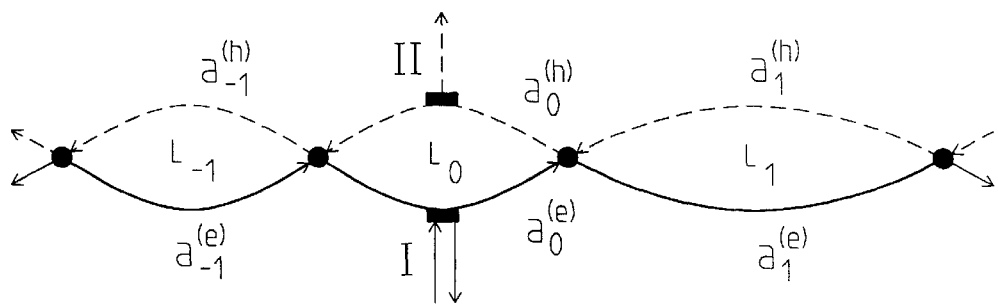

It can be realised that the main contribution to the phase sensitive part of the conductance comes from the trajectories, shown in FIGS. 4A, 4B, having the features that they contain both equal electron and hole parts, so that the phase gain along such trajectories can be largely compensated and that successive normal reflections along such trajectories occur at different FM-SC boundaries.

The transmission amplitude along such a path can be found in terms of amplitudes $a_{n\ \uparrow,\ \downarrow}^{e,\ h)}$ at sections of the path between two successive reflections, where n=0, ±1, ±2, ... being the section number, and the superscript e or h shows that the amplitude belongs to the electron or hole trajectory inside it, respectively. Electron trajectories are indicated through a continuous line whereas hole trajectories are illustrated through dahsed lines. At the reflection points at the FM-SC boundaries represented through dots in FIG. 4b the amplitudes are connected through a unitary 2×2 matrix, the elements of which are amplitudes of the Andreev and normal reflections, c.f. Pis'ma Zh. Eksp. Teor. Fiz. 32, 122 (1980) (JETP Lett.) by A. L. Shelankov; Phys. Rev. B 25, 4515 (1982) by G. E. Blonder, et al. The electron and hole amplitudes on the left-side and the right-side of section 0 (points I and II in FIG. 4b are connected with each other and the amplitudes in the lead to the reservoir through a 2×2 unitary matrix which describes the scattering at the potential barrier between the ferromagnet and the reservoir lead. By matching the amplitudes a set of linear algebraic equations is obtained for the amplitudes $a_n^{(e,\ h)}$, n=0, ±1, ... with a given right side proportional to the transparency of the potential barrier, $t_r$. The coefficients of the set depend on the energy E and the lengths through the phase gains.

In a dirty metal, trajectories in two neighbouring sections are of significantly different shapes, and therefore their lengths are completely uncorrelated. From the matching equations follows that the problem is equivalent to the one of finding the probability amplitude for a quantum motion along a disordered one-dimensional chain of barriers, the transparency of the barriers being $t^2 \equiv |r_N|^2 < 1$.

In other words, the problem is reduced to the resonant transmission of an electron through quantum states formed in a one-dimensional chain of barriers the positions of which are disordered in space. Such states are known to be localized, and we are interested in those that are located around the section containing the injectin point. In FIG. 4A are thus the Andreev reflections illustrated which, if, the phase difference is equal to $(2n+1)\pi$, enables transport along the same trajectory.

Figure 5:
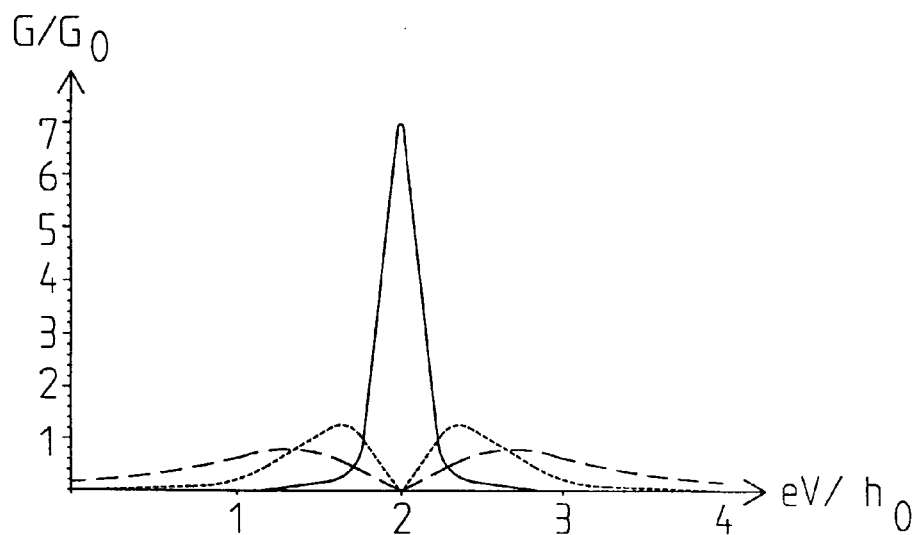

FIG. 5 shows the sensitivity of the conductance (here the relative conductance $G/G_O$) as a function of the applied energy, or the applied voltage. A continuous line relates to the case when $\Delta\phi$ is an odd multiple of $\pi$, the dotted line relates to the case when $\Delta\phi=1.1\times\pi$ and the dashed line relates to the case when $\Delta\phi=1.2\times\pi$ and $G_O=\sqrt{2}e^2 N_\perp t_r/h$ and the applied voltage is V. Thus, as can be seen, if $\Delta\phi$ is an odd multiple of $\pi$, and the normal reflections are the same at both boundaries, there is a symmetry between the clock- and counterwise, clockwise motions of electron-hole pairs in the ferromagnetic base electrode and the energy level $h_O$ is degenerated. Under that condition the maximum of the resonant transmission through Andreev levels is at an applied voltage $V=2h_O/e$ and a resonant peak in the conductance will be observed. It is here also supposed that $h_O/E_{th}=1$.

Figure 6:
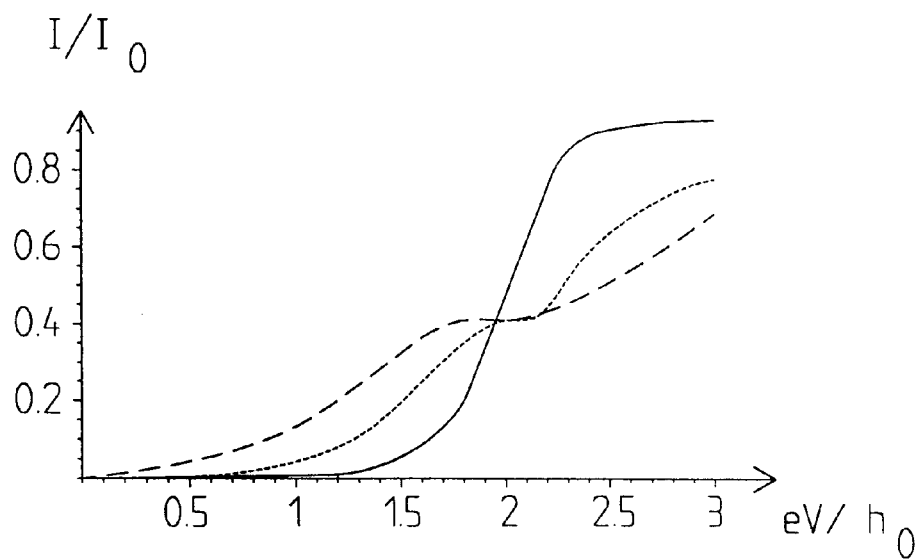
FIG. 6 shows the current-voltage characteristics for different phase differences.

In FIG. 6 current-voltage charactristics for phase differences $\phi=\pi$ (full line), $\Delta\phi=1.1\pi$ (dotted line) and $\phi=1.2\pi$ (dashed line) are illustrated. At low voltages, far from $2h_O/e$, (if not degenerated, normalized, $2h_O/e$) there is a resonant tunneling of quasi-particles through separate Andreev levels and the current level is low. When $V \approx 2h_O/e$, i.e. $V=V_B$, and $\Delta\phi=\pi$, the Andreev levels concentrate close to $h_O$ and there is a simultaneous resonant transport through the whole number of open transverse modes $N_\perp$ resulting in a jump of the current. As the voltage is further increased more carriers are resonantly tunneling through separate Andreev levels again and there is a slow increase observed in the current. When $\Delta\phi$ deviates from $\pi$ the number of Andreev levels concentrated close to $h_O$ decreases thus resulting in a decrease in the sesitivity of the current to the voltage. $I_O$ supposed to be $I_O=\sqrt{2}e^2 N_\perp t_r 2h_O/e$ and to summarize the conductance reaches a peak if $\Delta\phi \approx \pi$ and $V_B \approx 2h_O/e$ simultaneously.

In the above mentioned examples is related to an embodiment including diffusive ferromagnetic conductors. However, resonant tunneling through a ballistic mesoscopic ferromagnet resulting in high sensitivity of the conductance and the transport current on the superconductor phase difference and the applied voltage relates to another embodiment within the scope of the present invention.

What is claimed is:

1. An interferometer arrangement comprising:
    a source electrode and a drain electrode;
    a base electrode to which the source electrode and the drain electrode are connected through tunnel barriers, the base electrode thus forming a double barrier quantum well; and
    first and second superconducting gate electrodes to control the source-drain current, wherein
    the base electrode comprises a ferromagnetic material enabling resonant tunneling of source-drain electrons when there are bound states within the quantum well structure matching the energy of said source-drain electrons.

2. An interferometer arrangement according to claim 1, further comprising a transistor arrangement.

3. An interferometer transistor arrangement according to claim 1, wherein the output conductance depends on a first and a second parameter and in that first and second controlling means are provided to control the output conductance.

4. An arrangement according to claim 3, wherein the first parameter is the phase difference between the first and second superconducting electrodes and the first controlling means are used to control said phase difference.

5. An arrangement according to claim 4, wherein the first controlling means comprises means for providing a supercurrent through the gate electrodes provided by a control current source applied between the two superconducting gate electrodes.

6. An arrangement according to claim 4, wherein the first controlling means comprises means connecting the first and second superconducting gate electrodes to form a loop and means for application of a magnetic field to said loop.

7. An arrangement according to claim 3, wherein the second parameter is the exchange interaction energy of the ferromagnetic base electrode.

8. An arrangement according to claim 7, wherein the second controlling means comprises a voltage source and a voltage is applied to said ferromagnetic base electrode.

9. An arrangement at least according to claim 4 wherein to provide a high conductance or an output signal, the phase difference is controlled to be substantially $(2n+1)\pi$, wherein $n=0, \pm 1$, and in that the applied voltage substantially corresponds to the interaction energy of the ferromagnetic base electrode.

10. An arrangement according to claim 9, wherein the maximum output conductance is provided for $\Delta\phi=(2n+1)\pi$ and $V_B=2h_O/e$.

11. An arrangement according to claim 1 wherein the source and the drain electrodes comprise a normal metal selected from the group of metals consists of Au, Ag, Bi, the superconducting gate of electrodes comprise a metal selected from the group of metals consists of Pb, Al, Nb, Yt, Ba, CuO, and the ferromagnetic base electrode comprises a metal selected from the group of metals consisting of La, Sr, Ca or MnO.

12. An arrangement according to claim 1 wherein the ferromagnetic base electrode is mesoscopic.

13. An arrangement according to claim 9 wherein the arrangement forms a logical AND-element that provides an output signal when $\Delta\phi=(2n+1)\pi$ and $V_B=2h_O/e$ or corresponds to the interaction energy of the base electrode, i.e., where both $V_B$ and $I_G$ are input.

14. A logical element comprising a resonant tunneling interferometer, having a transistor comprising a source electrode and a drain electrode, a base electrode to which said source and drain electrodes respectively are connected via tunnel barriers, and first and second superconducting gate electrodes arranged to control the source-drain current $I_{SD}$ wherein the base electrode comprises a ferromagnetic material and wherein to provide an output signal corresponding to a high conductance a first input signal is provided to provide for the pase difference between the superconducting gate electrodes being $(2n+1)\pi$ and a second input signal in the form of a voltage $V_B$ applied to the ferromagnetic base electrode approximately corresponding to $(2h_O/e)$ the interaction exchange energy of the ferromagnet.

15. A logical element according to claim 14, wherein the output signal corresponding to the output conductance depends on first and second parameters respectively and wherein first and second controlling means are provided to control the output conductance, both said first and second controlling means having to be activated to provide an output signal.

16. A logical element according to claim 14, wherein the first input signal is provided by a first controlling means comprising means for producing a supercurrent and wherein the second controlling means comprises a voltage source providing the voltage $V_B$.

17. A logical element according to claim 14, wherein the first controlling means comprises means for connecting the first and second superconducting gate electrode and means for applying magnetic field to said loop resulting in a phase difference being an odd multiple of $\pi$.

18. A circuit comprising at least one AND element according to claim 14.

* * * * *